United States Patent [19]
Ogata et al.

[11] Patent Number: 6,122,332
[45] Date of Patent: Sep. 19, 2000

[54] APPARATUS FOR REDUCING IMPULSE NOISE IN HIGH-FREQUENCY DIGITAL RECEIVERS

[75] Inventors: Yoshiyuki Ogata, Tosu; Hiroaki Haruyama, Fukuoka, both of Japan

[73] Assignee: Matsushita Electric Industrial Co., Ltd., Osaka, Japan

[21] Appl. No.: 08/796,739

[22] Filed: Feb. 6, 1997

[30] Foreign Application Priority Data

Feb. 26, 1996 [JP] Japan ..................................... 8-037719

[51] Int. Cl.⁷ .............................. H04B 1/10; H03K 5/08; H04N 5/21
[52] U.S. Cl. .......................... 375/346; 375/351; 327/310; 348/607
[58] Field of Search ..................................... 375/351, 350, 375/346, 285; 455/222, 223, 296; 327/310; 348/607

[56] References Cited

U.S. PATENT DOCUMENTS

| | | |
|---|---|---|
| 4,466,129 | 8/1984 | Skutta . |
| 4,517,518 | 5/1985 | Ishigaki ................................. 455/223 |
| 4,528,678 | 7/1985 | Udren ..................................... 375/351 |
| 4,965,854 | 10/1990 | Glazebrook ............................. 375/351 |
| 5,210,518 | 5/1993 | Graham et al. ..................... 340/310 R |
| 5,212,827 | 5/1993 | Meszko et al. . |
| 5,901,172 | 5/1999 | Fontana et al. .......................... 375/200 |

OTHER PUBLICATIONS

Elektor Electronics "Noise Blanker", Jan. 1988, pp. 63.
T.A. Tong, "Noise Silencer for A.M. Receivers", Wireless World, Oct. 1972, pp. 483–484.

*Primary Examiner*—Stephen Chin
*Assistant Examiner*—Albert Park
*Attorney, Agent, or Firm*—Venable; Robert J. Frank; Catherine M. Voorhees

[57] ABSTRACT

A high-frequency radio signal receiving apparatus for digital communication includes a receiving antenna for receiving a high-frequency radio wave, a frequency converter for converting a signal supplied from the receiving antenna through a wide-band bandpass filter into a signal of an intermediate frequency band, an impulsive noise detecting unit for detecting impulsive noise on the basis of a signal outputted from the frequency converter. The apparatus further includes an impulsive noise correcting unit for correcting the signal outputted from the frequency converter in dependence on a signal outputted from the impulsive noise detecting unit, and a demodulating unit for demodulating a signal outputted from the impulsive noise correcting unit and supplied by way of a narrow-band bandpass filter.

56 Claims, 7 Drawing Sheets

FIG. 4A 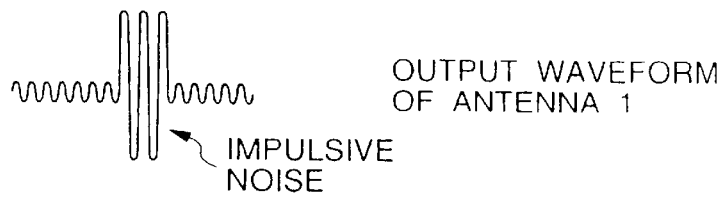
OUTPUT WAVEFORM OF ANTENNA 1
IMPULSIVE NOISE

FIG. 4B 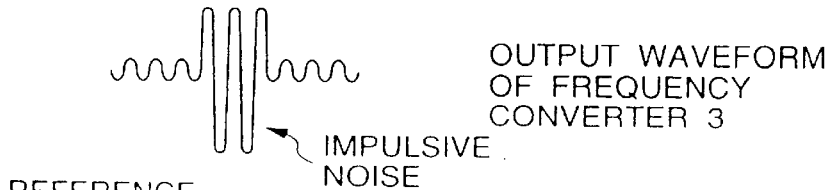
OUTPUT WAVEFORM OF FREQUENCY CONVERTER 3
IMPULSIVE NOISE

FIG. 4C 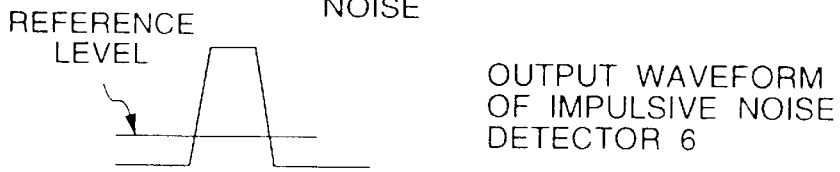
REFERENCE LEVEL
OUTPUT WAVEFORM OF IMPULSIVE NOISE DETECTOR 6

FIG. 4D 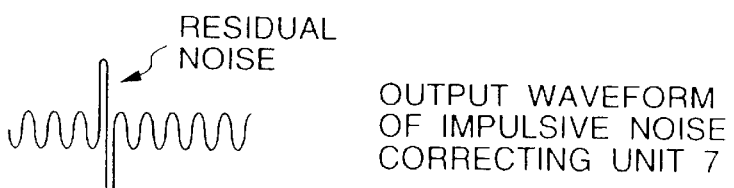
RESIDUAL NOISE
OUTPUT WAVEFORM OF IMPULSIVE NOISE CORRECTING UNIT 7

FIG. 4E 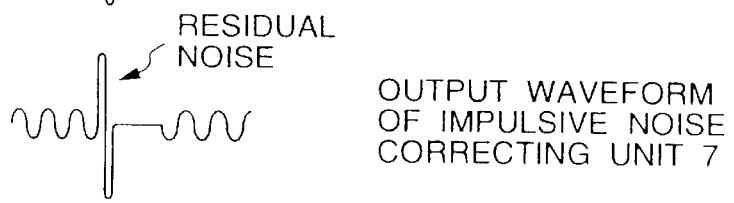
RESIDUAL NOISE
OUTPUT WAVEFORM OF IMPULSIVE NOISE CORRECTING UNIT 7

FIG. 4F 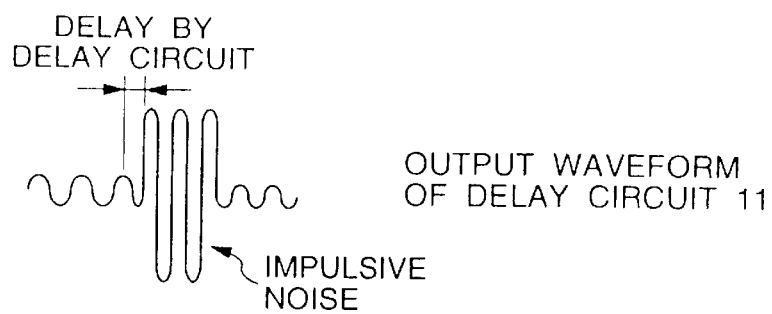
DELAY BY DELAY CIRCUIT
OUTPUT WAVEFORM OF DELAY CIRCUIT 11
IMPULSIVE NOISE FIG. 4G 
OUTPUT WAVEFORM OF IMPULSIVE NOISE CORRECTING UNIT 7

APPARATUS FOR REDUCING IMPULSE NOISE IN HIGH-FREQUENCY DIGITAL RECEIVERS

BACKGROUND OF THE INVENTION

The present invention relates generally to a high-frequency radio signal receiving apparatus for digital communication such as for satellite communication or the like. More specifically, the invention is concerned with a high-frequency radio signal receiving apparatus (hereinafter also referred to as the high-frequency radio signal receiver) which is essentially immune to the influence of noise such as impulsive noise.

In order to have a better understanding of the invention, a known or conventional high-frequency radio signal receiver for digital communication first will be described by reference to FIG. 7 of the accompanying drawing, which shows in a block diagram a general arrangement of the same. In FIG. 7, reference numeral 1 denotes a receiving antenna, 2 denotes a wide-band bandpass filter (hereinafter also referred to as the wide-band BPF), 3 denotes a frequency converter, 4 denotes a narrow-band bandpass filter (hereinafter also referred to as the narrow-band BPF), and numeral 5 denotes a demodulator.

With the structure mentioned above, the high-frequency radio signal receiver operates in the manner described below.

Referring to FIG. 7, upon reception of radio wave signal by the receiving antenna 1, the received signal is fed to the frequency converter 3 by way of the wide-band BPF 2 to be thereby converted into a signal of an appropriate intermediate frequency band. The signal outputted from the frequency converter 3 is caused to pass through the narrow-band BPF 4, whereby only the desired signal is extracted to be subsequently demodulated by the demodulator 5.

Unwanted signal components of the frequencies which are outside of the frequency band for reception are eliminated through cooperation of the wide-band BPF 2 and the narrow-band BPF 4. Among others, in the case of the high-frequency radio signal receivers for mobile facilities, the narrow-band BPF 4 is indispensably required in order to ensure effective utilization of the frequency bands.

In the conventional high-frequency radio signal receiver, there arises a problem mentioned below when disturbing waves such as impulsive noise mixed in the signal of the frequency band for reception are received by the receiving antenna 1. Parenthetically, the term "impulsive noise" as used herein is contemplated to mean such noise which has an extremely short time duration on the order of 10 to 100 μsec and high power or energy level. As the sources for generation of such noise, there may be mentioned transportation or transit facilities, industrial electric/electronic equipment, electric power transmission systems, motor vehicles and others. Incidentally, the impulsive noise is also known as city noise.

Here, it should be noted that such impulsive noise as mentioned above can not be eliminated with the aid of the wide-band BPF 2 and the narrow-band BPF 4 and that the temporal duration of the impulsive noise undergoes elongation during the course of processing performed by the narrow-band BPF 4, thus involving loss of the intrinsic or desired signal components.

Such being the circumstances, the conventional high-frequency radio signal receiver suffers a serious problem that a reception error ratio increases due to intervention of the impulsive noise, which may ultimately lead to the incapability of communication or loss of the communication capability of receiver as a whole.

For coping with the problem mentioned above, a logic circuit designed for bit error correction has heretofore been employed in association with the demodulator 5. However, this logic circuit is very complicated in structure and implemented in a large size. For this reason, a great inconvenience is encountered in installing the logic circuit in the portable-type apparatuses and/or mobiles. Besides, such a logic circuit provides significant increase in the manufacturing cost for the high-frequency radio signal receiver for the digital communication.

SUMMARY OF THE INVENTION

In light of the state of the art described above, it is an object of the present invention to provide a high-frequency radio signal receiving apparatus for digital communication which is essentially in insusceptible to the influence of impulsive noise.

More particularly, it is an object of the present invention to provide a high-frequency radio signal receiving apparatus for digital communication which is capable of preventing the reception error ratio from increasing in spite of the reception of impulsive noise and which can be manufactured inexpensively in a simplified structure.

In view of the above and other objects which will become apparent as the description proceeds, there is provided according to a general aspect of the present invention a high-frequency radio signal receiving apparatus for digital communication which includes a receiving antenna for receiving a high-frequency radio wave signal, a frequency converter for converting a signal received by the receiving antenna into a signal of an intermediate frequency band, an impulsive noise detector for detecting impulsive noise on the basis of a signal outputted from the frequency converter, an impulsive noise correcting unit for correcting the signal outputted from the frequency converter in dependence on the signal outputted from the impulsive noise detector, and a demodulator for demodulating a signal outputted from the impulsive noise correcting unit and supplied by way of a narrow-band bandpass filter.

By virtue of the arrangement of the high-frequency radio signal receiving apparatus described above, the impulsive noise positively can be corrected by the impulsive noise correcting unit upon detection of the noise by the impulsive noise detector before the received signal is inputted to the data demodulator, whereby the reception error ratio can be prevented from increasing. Thus, it is possible to prevent the communication capability or function of the high-frequency radio signal receiving apparatus from being lost, to a great advantage.

In a preferred mode for carrying out the invention, the impulsive noise correcting unit may be composed of an on/off-type two-terminal switch and an attenuator for attenuating a signal in response to operation of the on/off-type two-terminal switch such that when a signal indicating detection of impulsive noise is outputted from the impulsive noise detector, the on/off-type two-terminal switch of the impulsive noise correcting unit is opened to thereby allow the signal outputted from the frequency converter to be attenuated by the attenuator. Owing to the arrangement described above, the impulsive noise is attenuated by the impulsive noise correcting unit upon detection thereof by the impulsive noise detector, whereby the reception error ratio can be prevented from increasing with the communication capability of the high-frequency radio signal receiving apparatus from degradation, malfunction or loss.

In another preferred mode for carrying out the invention, the impulsive noise correcting unit may include a multiplexer-type three-terminal switch having a first terminal serving as an input terminal for the signal outputted from the frequency converter, a second terminal serving as an output terminal of the impulsive noise correcting unit and a third terminal connected to the ground, wherein when a signal indicating detection of impulsive noise is outputted from the impulsive noise detector, the second terminal of the multiplexer-type three-terminal switch of the impulsive noise correcting unit is closed or connected to the third terminal. With the arrangement described above, upon detection of the impulsive noise by the noise detector, the impulsive noise can be eliminated or suppressed substantially to zero by the impulsive noise correcting unit, whereby the amount of noise can significantly be reduced, which in turn means that the reception error ratio can be prevented from increasing even when the intrinsic or main signal such as data signal of concern as received is of a low input level. Thus, the communication capability of the high-frequency radio signal receiving apparatus can be ensured even in the environment where the incoming radio signal is feeble.

In yet another mode for carrying out the invention, the high-frequency radio signal receiving apparatus may further include a delay circuit for delaying a signal outputted from the frequency converter, before the signal is supplied to the impulsive noise correcting unit. Owing to this arrangement, a delay in the response of the impulsive noise detector can be compensated for, whereby residual noise components which may otherwise remain even after the correction performed by the impulsive noise correcting unit due to the delay in the operation of the impulsive noise detector can be suppressed substantially to zero. Thus, the reception error ratio of the high-frequency radio signal receiving apparatus can be prevented from increasing with enhanced reliability. Besides, because of suppression of the residual impulsive noise components after the correction, substantially no offensive spike-like noise can be perceived in the demodulated data signal. Additionally, the arrangement mentioned above can be realized by employing inexpensive circuit elements of small size without need for the use of elements capable of withstanding high voltage or load. Thus, the high-frequency radio signal receiving apparatus can be implemented inexpensively in a small or miniature size.

In still another mode for carrying out the invention, the impulsive noise detector may be composed of an envelope detector for detecting an envelope of the signal outputted from the frequency converter, a mean input level detector for detecting a mean input level of a signal outputted from the envelope detector, and a comparator for detecting impulsive noise by comparing two signals outputted from the envelope detector and the mean input level detector, respectively. With the structure of the impulsive noise detector described above, the mean input level can be employed as the reference for the comparison. Owing to this feature, the high-frequency radio signal receiving apparatus can cope with a wide dynamic range of the input levels, whereby the high-frequency radio signal receiving apparatus can enjoy an enhanced capability for the detection of impulsive noise.

In yet another mode for carrying out the invention, the high-frequency radio signal receiving apparatus may further include a waveform shaper for shaping a signal outputted from the impulsive noise detector, a pulse width measuring circuit for measuring a pulse width of a digital signal outputted from the waveform shaper, a decision unit for making decision concerning reliability of received data on the basis of a signal outputted from the pulse width measuring circuit, and a messaging unit for informing a result of decision performed by the decision unit. By virtue of the arrangement described above, information concerning the reliability of the received data is made available for operator or user. In other words, on the basis of the message or information mentioned above, the user may issue a demand or request for resending of data or he or she may change the location for the reception, whereby reliability of the data as received can further be enhanced as a whole.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which:

FIGS. 4A–4G are waveform diagrams illustrating schematically waveforms of signals outputted by circuit components in the high-frequency radio signal receiving apparatuses for digital communication according to the invention;

DESCRIPTION OF THE PREFERRED EMBODIMENTS

Figure 1:
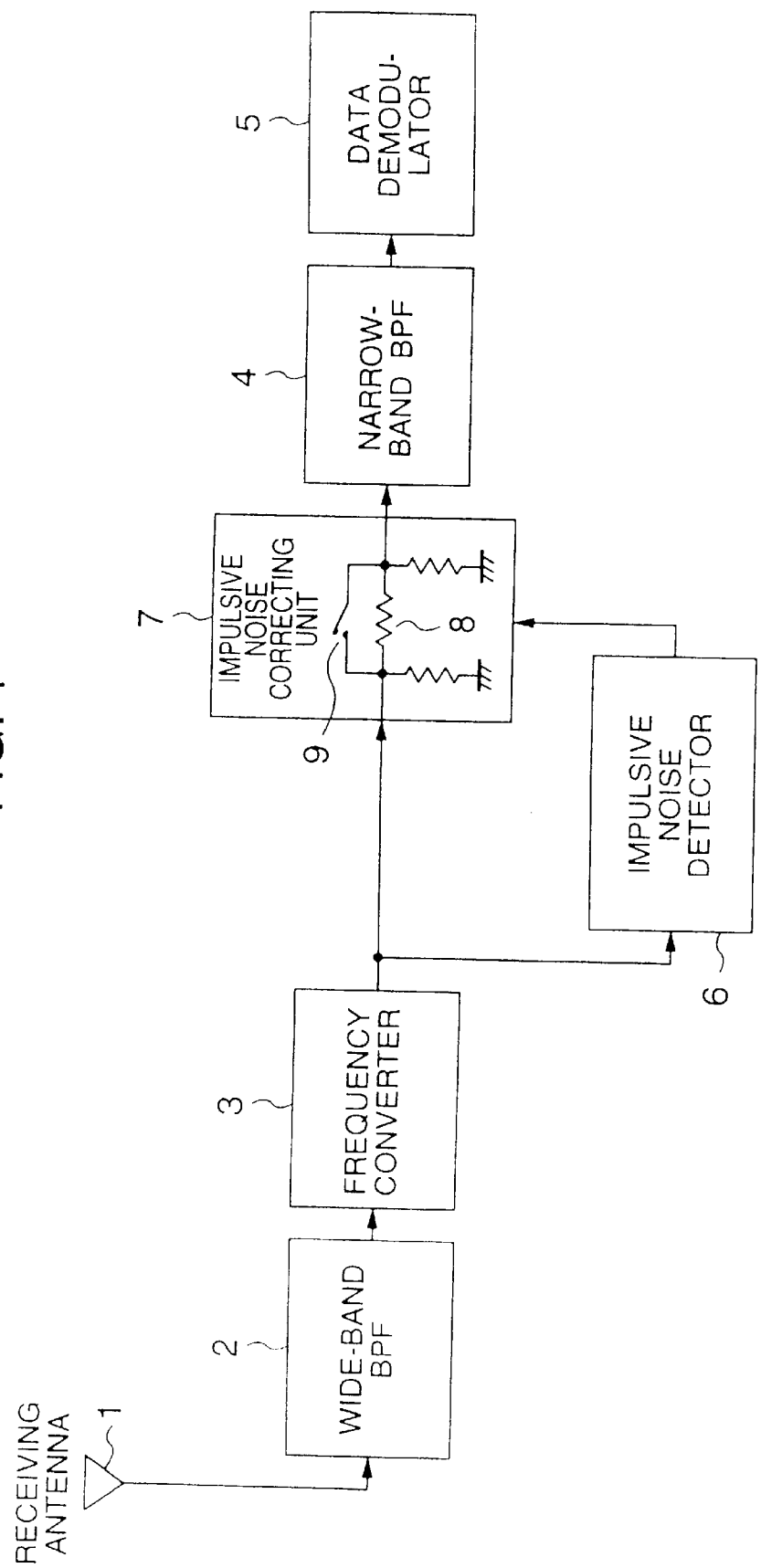
FIG. 1 is a block diagram showing a general arrangement of a high-frequency radio signal receiving apparatus for digital communication according to a first embodiment of the present invention.

Now, the present invention will be described in detail in conjunction with preferred or exemplary embodiments thereof by reference to the drawings. In the following description, like reference characters designate like or corresponding parts throughout the several views.

Embodiment 1

FIG. 1 is a block diagram showing in general an arrangement of a high-frequency radio signal receiving apparatus for digital communication according to a first embodiment of the present invention. In FIG. 1, reference numeral 1 denotes a receiving antenna, 2 denotes a wide-band band-pass filter (hereinafter referred to as the wide-band BPF), 3 denotes a frequency converter, 4 denotes a narrow-band bandpass filter (hereinafter referred to as the narrow-band BPF), 5 denotes a demodulator, 6 denotes an impulsive noise detector, and reference numeral 7 denotes an impulsive noise correcting unit. As can be seen in FIG. 1, the impulsive noise correcting unit 7 comprises an attenuator 8 constituted by resistors and an on/off-type two-terminal switch 9.

As can be seen in the figure, the receiving antenna 1 is connected to the frequency converter 3 by way of the wide-band BPF 2. Output of the frequency converter 3 is inputted to the impulsive noise detector 6 and the impulsive noise correcting unit 7. On the other hand, the output terminal of the impulsive noise detector 6 is connected to a gate control signal input terminal (not shown) of the impulsive noise correcting unit 7, the output of which in turn is connected to the input terminal of the narrow-band BPF 4 which has the output terminal connected electrically to the input of the demodulator 5.

Now, the operation of the high-frequency radio signal receiving apparatus for digital communication implemented in the aforementioned structure will be described by referring to FIGS. 4A–4G which show schematically waveforms of signals generated by several components of the high-frequency radio signal receiving apparatus for digital communication, wherein the signal waveforms shown in FIGS. 4A–4D are relevant to the high-frequency radio signal receiving apparatus according to the instant embodiment of the invention.

Referring to FIG. 1 together with FIGS. 4A–4D, a signal fed from the receiving antenna 1 upon reception of radio wave is inputted to the wide-band BPF 2 in which irrelevant or unwanted signal components are removed. The signal outputted from the wide-band BPF 2 then undergoes a frequency conversion into an intermediate frequency band by means of the frequency converter 3. In this conjunction, a signal waveform fed from the receiving antenna 1 is shown in FIG. 4A, while a waveform of the signal outputted from the frequency converter 3 is shown in FIG. 4B. As can be seen from these waveform diagrams, impulsive noise components contained in the signal fed from the receiving antenna 1 remain intact in the output of the frequency converter 3. To say this in another way, so far as the operation of the circuitry composed of the receiving antenna 1, the wide-band BPF 2 and the frequency converter 3 is concerned, there exists no essential difference between the high-frequency radio signal receiver according to the invention and the conventional one.

The impulsive noise detector 6 is designed to serve for detecting the presence or absence of the impulsive noise component in the signal outputted from the frequency converter 3 through an envelope detection. More specifically, detection of the impulsive noise component through the envelope detection can be realized by determining whether or not an enveloping curve or waveform passing through the peaks of the waveform of the signal outputted from the frequency converter 3 has a level exceeding a predetermined fixed reference voltage level, as is illustrated in FIG. 4C. When the envelope waveform has a level exceeding the fixed reference voltage level, it is then decided that the signal outputted from the frequency converter 3 contains an impulsive noise component, whereupon the impulsive noise detector 6 shapes the signal supplied from the frequency converter 3 into a gate signal which is supplied to the impulsive noise correcting unit 7.

In the impulsive noise correcting unit 7, so long as the gate signal outputted from the impulsive noise detector 6 is logic "0", indicating the absence of the impulsive noise component, the on/off-type two-terminal switch 9 remains in the closed or turned-on state, whereby the signal supplied from the frequency converter 3 is transferred to the narrow-band BPF 4 as it is. By contrast, when the gate signal is logic "1", indicating presence of the impulsive noise component in the signal outputted from the frequency converter 3, the on/off-type two-terminal switch 9 of the impulsive noise correcting unit 7 is opened (turned off), as a result of which the signal portion containing the impulsive noise component is forced to pass through the attenuator 8. Thus, the impulsive noise component is attenuated and then supplied to the narrow-band BPF 4. The waveform of the attenuated signal outputted from the impulsive noise correcting unit 7 is illustrated in FIG. 4D.

The signal outputted from the impulsive noise correcting unit 7 is supplied to the demodulator 5 by way of the narrow-band BPF 4 to be thereby demodulated as in the case of the conventional high-frequency radio signal receiver known heretofore.

As will now be appreciated from the foregoing description, in the high-frequency radio signal receiving apparatus for digital communication according to the instant embodiment of the invention, disturbing waves such as the impulsive noise falling within the reception frequency band and contained in the received signal can be detected by the impulsive noise detector 6 and attenuated by the attenuator 8 which constitutes a part of the impulsive noise correcting unit 7. Thus, adverse influence of impulsive noise can be suppressed, whereby the reception error ratio is protected from increasing or degradation.

Embodiment 2

Figure 2:
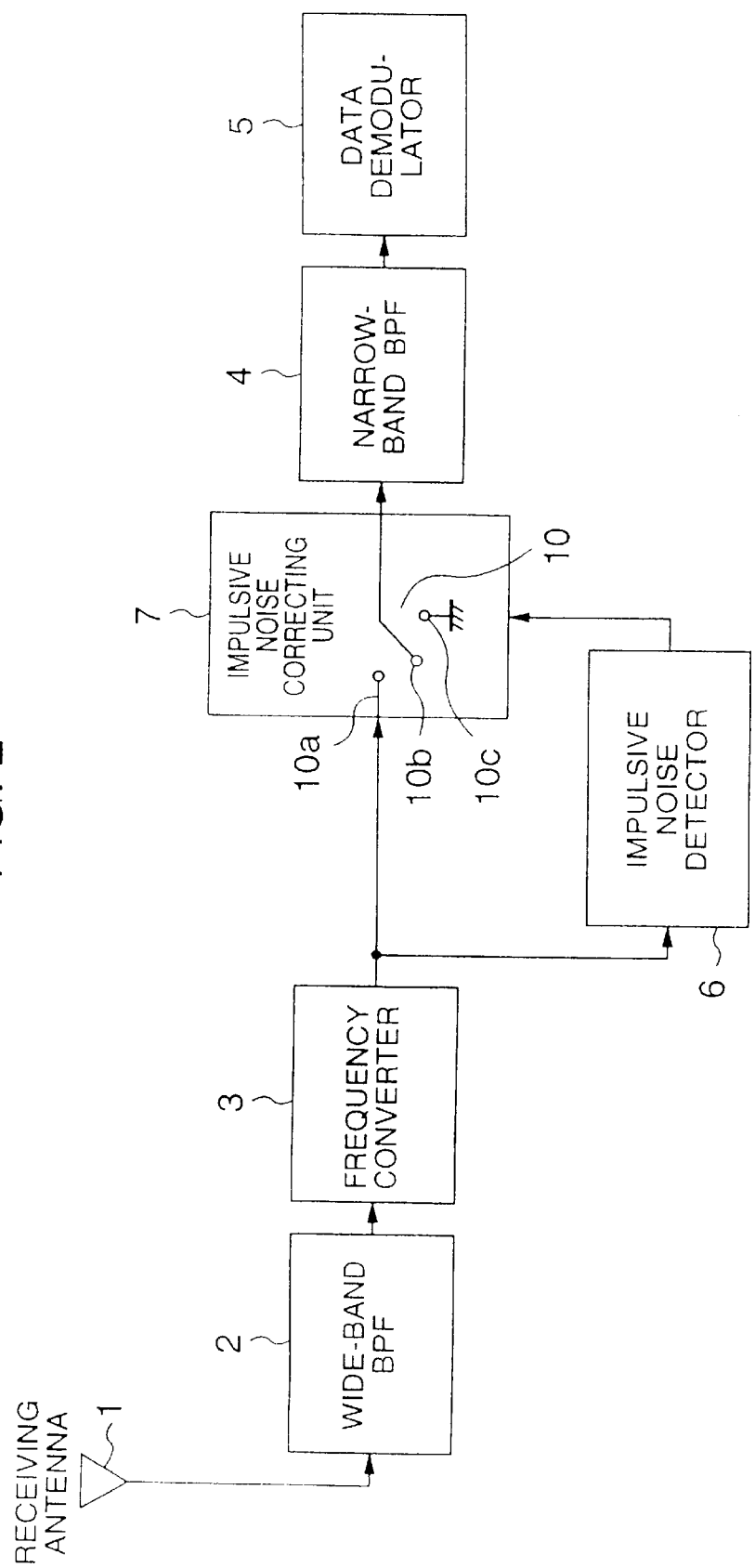
FIG. 2 is a block diagram showing generally a circuit configuration of a high-frequency radio signal receiving apparatus for digital communication according to a second embodiment of the invention.

FIG. 2 is a block diagram showing in general an arrangement of a high-frequency radio signal receiving apparatus for digital communication according to a second embodiment of the invention. The high-frequency radio signal receiving apparatus according to the instant embodiment differs from that of the first embodiment in the structure of the impulsive noise correcting unit 7. More specifically, in the case of the high-frequency radio signal receiving apparatus according to the second embodiment of the invention, the impulsive noise correcting unit 7 includes a multiplexer-type three-terminal switch 10 which has a first terminal 10a serving as the input terminal of the impulsive noise correcting unit 7, a second terminal 10b serving as an output terminal of the impulsive noise correcting unit 7 and a third terminal 10c connected to the ground potential. The impulsive noise correcting unit 7 is so configured that either the first terminal 10a or the third terminal 10c is selected by the second terminal 10b in dependence on the gate signal supplied from the impulsive noise detector 6. Except for the structure of the impulsive noise correcting unit 7 mentioned above, the high-frequency radio signal receiving apparatus according to the second embodiment is essentially same as the that of the first embodiment. Accordingly, repeated description will be unnecessary.

Referring to FIG. 2 together with FIG. 4E, the signal fed from the receiving antenna 1 undergoes impulsive noise detecting operation of the impulsive noise detector 6 after having been processed by the wide-band BPF 2 and the frequency converter 3, as in the case of the high-frequency radio signal receiving apparatus according to the first embodiment of the invention. In the impulsive noise correcting unit 7, so long as the gate signal outputted from the impulsive noise detector 6 is logic "0", indicating absence of the impulsive noise component, the second terminal 10b of the multiplexer-type three-terminal switch 10 is closed to the first terminal 10a, whereby the signal supplied from the frequency converter 3 is transmitted to the narrow-band BPF 4 as it is. By contrast, when the gate signal is logic "1", indicating presence of the impulsive noise component in the signal outputted from the frequency converter 3, the second terminal 10b and the third terminal 10c of the multiplexer-type three-terminal switch 10 are closed to each other, as a result of which the signal portion containing the impulsive noise component is forced to be shunt to the ground, whereby the signal portion containing the impulsive noise is intercepted. The waveform of the signal outputted from the impulsive noise correcting unit 7 composed of the multiplexer-type three-terminal switch 10 is illustrated in FIG. 4E.

As will now be appreciated from the foregoing description, in the high-frequency radio signal receiving apparatus according to the second embodiment of the invention, when the presence of the impulsive noise in the received signal is detected by the impulsive noise detector 6, the impulsive noise is eliminated by connecting the input terminal of the multiplexer-type three-terminal switch 10 constituting the impulsive noise correcting unit 7 to the ground potential. Thus, adverse influence of the impulsive noise can positively be suppressed or prevented, whereby the reception error ratio is protected against increasing or degradation.

Embodiment 3

Figure 3:
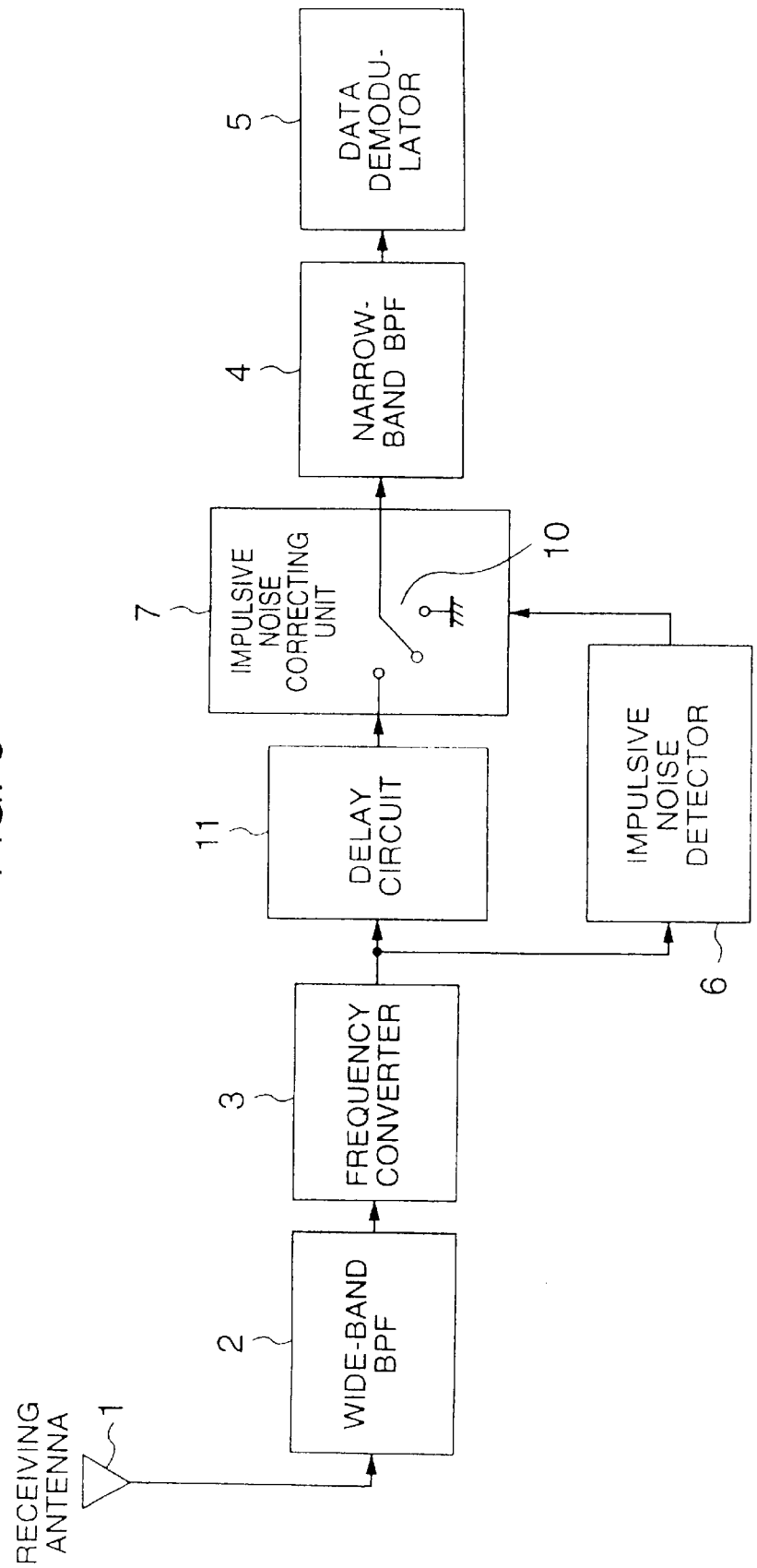
FIG. 3 is a block diagram showing generally a configuration of a high-frequency radio signal receiving apparatus for digital communication according to a third embodiment of the invention.

FIG. 3 is a block diagram showing in general an arrangement of a high-frequency radio signal receiving apparatus for digital communication according to a third embodiment of the present invention. As can be seen in FIG. 3, the high-frequency radio signal receiving apparatus according to the instant embodiment differs from that of the second embodiment in that a delay circuit 11 is provided between the frequency converter 3 and the impulsive noise correcting unit 7 in addition to the structure of the high-frequency radio signal receiving apparatus according to the second embodiment. Except for this difference, the high-frequency radio signal receiving apparatus according to the third embodiment of the invention is essentially same as that of the second embodiment. Accordingly, the following description will be directed only to the difference.

The signal outputted from the frequency converter 3 is inevitably subjected to a minute delay upon passing through the impulsive noise detector 6, which delay is reflected as a delay in the response of the impulsive noise correcting unit 7. Because of such delay, the impulsive noise correcting unit 7 can not completely eliminate the impulsive noise components, incurring a problem that some of the impulsive noise components may remain without being corrected, as is illustrated in FIGS. 4D, 4E.

With the third embodiment of the invention, it is contemplated that the above mentioned problem be overcome. Referring to FIG. 3, the signal outputted from the frequency converter 3 is supplied to the impulsive noise detector 6 and the delay circuit 11. The signal component passing through the impulsive noise detector 6 is accompanied with a minute delay, as mentioned previously. By taking into consideration the minute delay, the delay circuit 11 is so designed as to delay the signal to be transmitted from the frequency converter 3 to the impulsive noise correcting unit 7 such that the minute delay brought about by the impulsive noise detector 6 can be compensated for. Thus, the impulsive noise correcting unit 7 is capable of performing the signal processing on the real time basis, whereby all the impulsive noise components contained in the signal outputted from the frequency converter 3 can be corrected or cancelled out satisfactorily in response to the gate signal supplied from the impulsive noise detector 6 nevertheless of the minute delay incurred thereby. Incidentally, the output waveform of the impulsive noise correcting unit 7 is illustrated in FIG. 4G.

At this juncture, it should be added that the delay circuit 11 described above may equally be employed in the high-frequency radio signal receiving apparatus according to the first embodiment shown in FIG. 1.

As is apparent from the foregoing description, owing to the arrangement that the signal outputted from the frequency converter 3 is transmitted to the impulsive noise correcting unit 7 by way of the delay circuit 11 with a delay corresponding to that incurred by the impulsive noise detector 6, the impulsive noise correcting unit 7 can eliminate satisfactorily the impulsive noise components, whereby degradation of the reception error ratio due to the impulsive noise can be prevented more positively with highly improved reliability.

Embodiment 4

Figure 5:
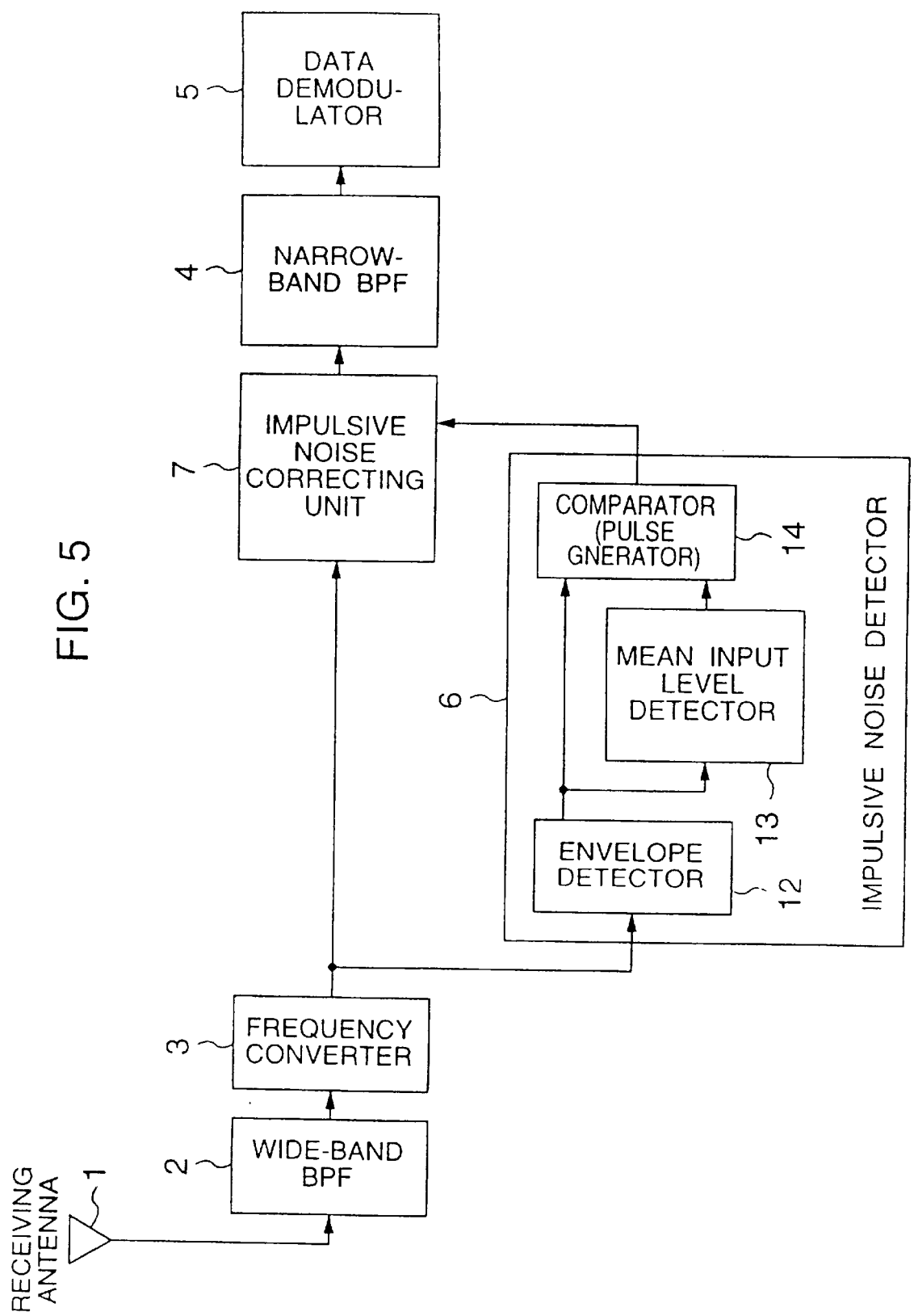
FIG. 5 is a block diagram showing generally an arrangement of a high-frequency radio signal receiving apparatus for digital communication according to a fourth embodiment of the present invention.

FIG. 5 is a block diagram showing in general an arrangement of a high-frequency radio signal receiving apparatus for digital communication according to a fourth embodiment of the present invention. In the figure, reference numeral 12 denotes an envelope detector for detecting an envelope waveform of the signal outputted from the frequency converter 3, numeral 13 denotes a mean input level detector for detecting a mean input level of the signal outputted from the envelope detector 12, and numeral 14 denotes a comparator for comparing the both signals outputted from the envelope detector 12 and the mean input level detector 13, respectively, for thereby detecting presence of impulsive noise.

As can be seen from FIG. 5, the impulsive noise detector 6 is comprised of the envelope detector 12, the mean input level detector 13 and the comparator 14 mentioned above. Thus, the instant embodiment of the invention is directed to a circuit configuration as well as operation of the impulsive noise detector 6 mentioned hereinbefore in conjunction with the first to third embodiments.

Again referring to FIG. 5, in the impulsive noise detector 6, the signal outputted from the frequency converter 3 undergoes envelope detection by the envelope detector 12, whereupon a mean level of a signal outputted from the envelope detector 12 is detected by the mean input level detector 13. On the other hand, the comparator 14 compares the mean level signal outputted from the mean input level detector 13 with the output signal of the envelope detector 12. When the signal level outputted from the envelope detector 12 exceeds the mean value or level outputted from the mean input level detector 13, then the presence of impulsive noise is determined. Thus, a signal indicative of detection of the impulsive noise is supplied to the impulsive noise correcting unit 7. Parenthetically, the comparator 14 may be constituted by a differential amplifier or the like, while the mean input level detector 13 may be realized by using an appropriate low-pass filter constituted by resistor(s) and capacitor(s).

By making use of the mean level signal outputted from the mean input level detector 13 as the reference for the comparison to be performed by the comparator 14, it is possible to detect impulsive noise even when the input level should change. In other words, a wide dynamic range can be ensured for the high-frequency radio signal receiving apparatus according to the fourth embodiment of the invention.

Embodiment 5

Figure 6:
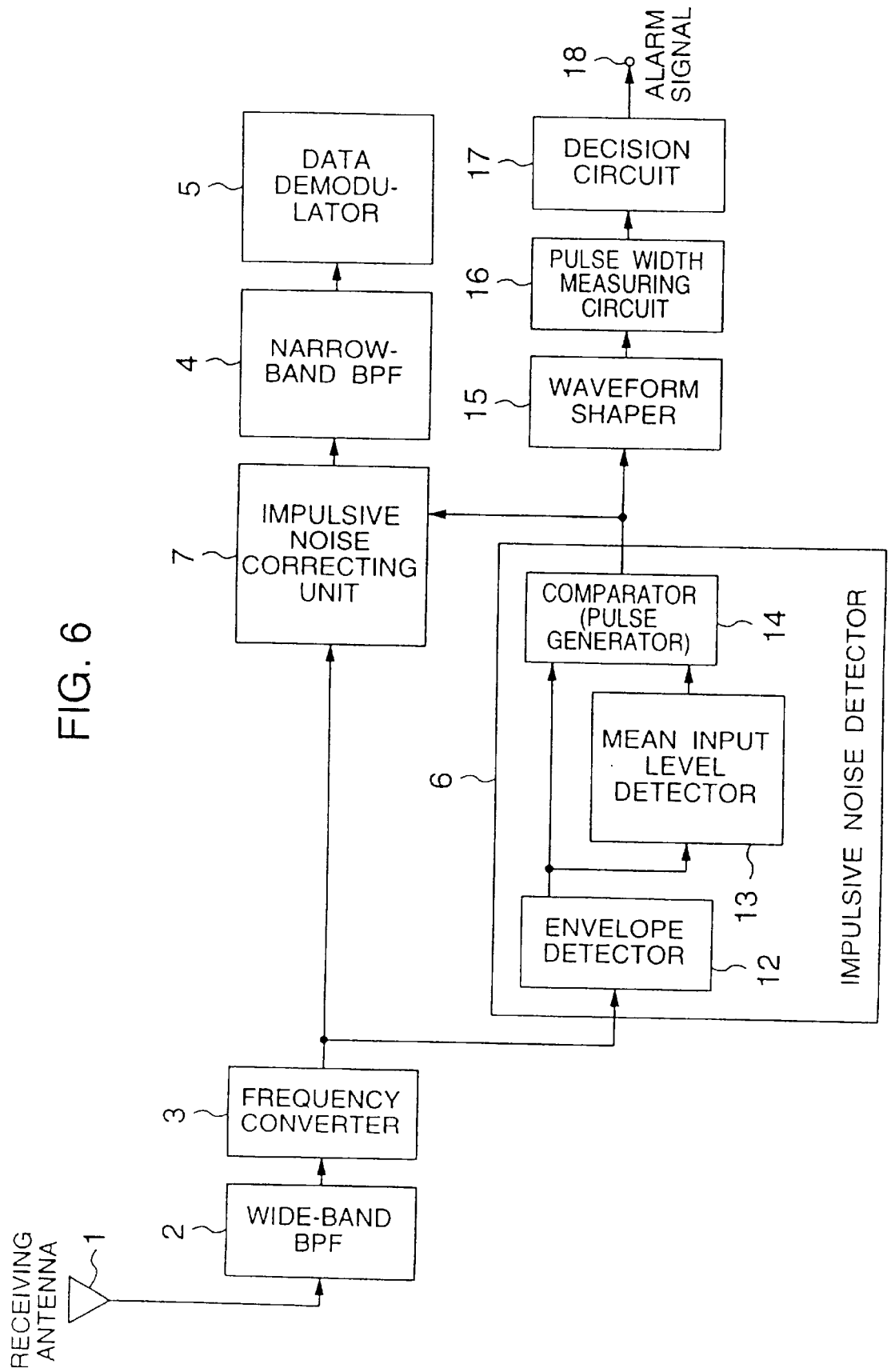
FIG. 6 is a block diagram showing generally an arrangement of a high-frequency radio signal receiving apparatus for digital communication according to a fifth embodiment of the present invention.
Figure 7:
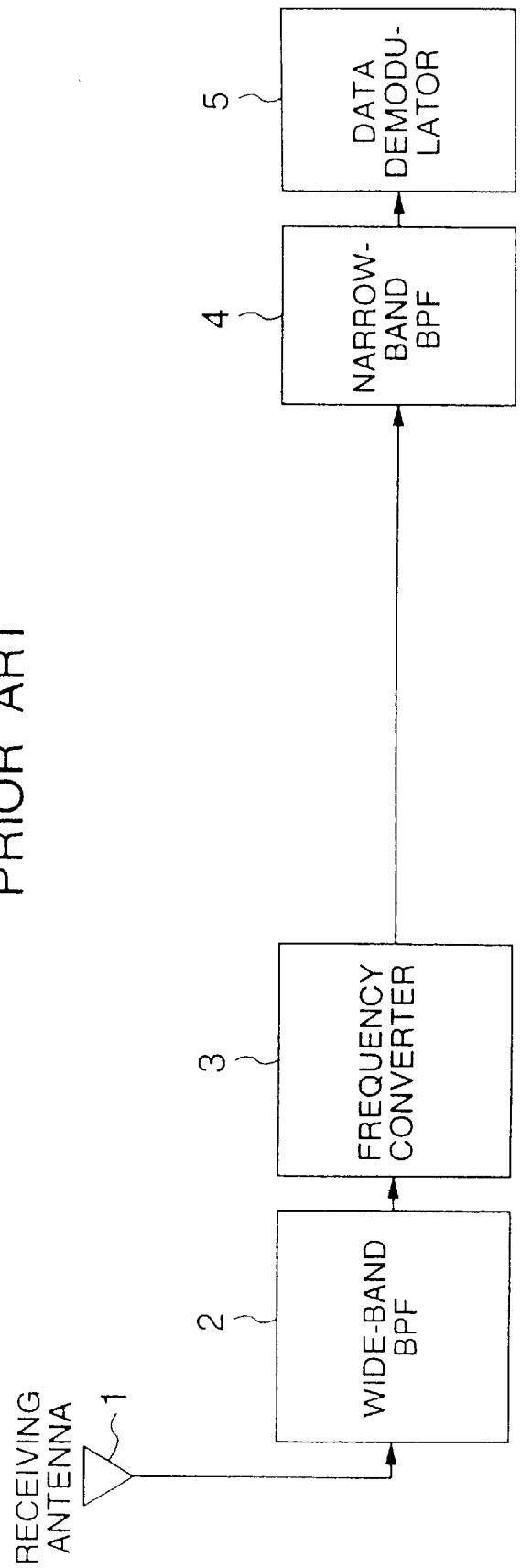
FIG. 7 is a block diagram showing an arrangement of a conventional high-frequency radio signal receiving apparatus for digital communication.

FIG. 6 is a block diagram showing in general an arrangement of a high-frequency radio signal receiving apparatus for digital communication according to a fifth embodiment of the present invention. In the figure, reference numeral 15 denotes a waveform shaper for shaping an output signal of the impulsive noise detector 6, numeral 16 denotes a pulse width measuring circuit for measuring a pulse width of a digital signal obtained after the shaping of the output signal of the impulsive noise detector 6 by the waveform shaper 15, numeral 17 denotes a decision circuit for making decision concerning reliability of the received data on the basis of the output signal of the pulse width measuring circuit 16, and numeral 18 denotes an alarm signal output terminal.

As can be seen in FIG. 6, the signal outputted from the impulsive noise detector 6 is shaped into a digital or pulse signal by the waveform shaper 15. The pulse width of the digital signal outputted from the waveform shaper 15 is measured by the pulse width measuring circuit 16, and a signal indicating the pulse width as measured is supplied to the decision circuit 17. In response, the decision circuit 17 determines a time duration of the signal outputted from the pulse width measuring circuit 16, i.e., the time duration during which presence or inclusion of impulsive noise is detected by the impulsive noise detector 6. When this time duration exceeds a predetermined time, e.g. 206 $\mu$sec (corresponding to-one bit at a transmission rate of 4800 bps), the decision circuit 17 decides that the received data is poor in reliability. In that case, an alarm signal is outputted from the alarm signal output terminal 18 to inform a user of low reliability of the received data.

In response to the alarm signal indicating low reliability of the received data, the user may demand resending of the data or move to another place (when the receiving apparatus is used as a terminal device) or take other appropriate measures to enable receiving the data with high reliability.

At this juncture, it should be added that although the alarm signal is employed for informing the user of the result of decision made by the decision circuit 17, other appropriate messaging device such as a photodiode or the like may be employed for alarming visually, substantially to the same effect.

Many features and advantages of the present invention are apparent form the detailed description and thus it is intended by the appended claims to cover all such features and advantages of the system which fall within the true spirit and scope of the invention. Further, since numerous modifications and combinations will readily occur to those skilled in the art, it is not intended to limit the invention to the construction and operation illustrated and described.

By way of example, the delay circuit described in conjunction with the high-frequency radio signal receiver shown in FIG. 3 may equally be employed in the receivers according to the other embodiments such as shown in FIGS. 5 and 6 substantially for the same purpose as described previously.

Accordingly, all suitable modifications and equivalents may be resorted to, falling within the spirit and scope of the invention.

We claim:

1. A high-frequency radio signal receiving apparatus for digital communication, comprising:

a receiving antenna for receiving a high frequency radio wave;

a frequency converter for converting a signal supplied from said receiving antenna into a signal of an intermediate frequency band;

impulsive noise detecting means for detecting impulsive noise on the basis of a signal outputted from said frequency converter;

impulsive noise correcting means for correcting the signal outputted from said frequency converter in dependence on a signal outputted from said impulsive noise detecting means, said impulsive noise correcting means including:

an on/off-type two-terminal switch; and an attenuator connected to said on/off-type two-terminal switch in parallel, and for attenuating a signal when said on/off-type two-terminal switch is opened, wherein when a signal indicating detection of impulsive noise is outputted from said impulsive noise detecting means, said on/off-type two-terminal switch of said impulsive noise correcting means is opened to thereby allow the signal outputted from said frequency converter to be attenuated by said attenuator, whereby the impulsive noise is suppressed from the signal outputted from said frequency converter without increasing a reception error ratio; and demodulating means for demodulating a signal outputted from said impulsive noise correcting means.

2. A high-frequency radio signal receiving apparatus for digital communication according to claim 1, further comprising:

a delay circuit for delaying the signal outputted from said frequency converter, before said signal is supplied to said impulsive noise correcting means.

3. A high-frequency radio signal receiving apparatus for digital communication according to claim 1, said impulsive noise detecting means including:

an envelope detector for detecting an envelope of the signal outputted from said frequency converter;

a mean input level detector for detecting a mean level of a signal outputted from said envelope detector; and a comparator for detecting impulsive noise by comparing two signals outputted from said envelope detector and said mean input level detector, respectively.

4. A high-frequency radio signal receiving apparatus for digital communication according to claim 1, further comprising:

a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

5. A high-frequency radio signal receiving apparatus for digital communication according to claim 1, said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to ground potential, wherein when a signal indicating detection of impulsive noise is outputted from said impulsive noise detecting means, said second terminal of the multiplexer-type three-terminal switch of the impulsive noise correcting unit is connected to said third terminal.

6. A high-frequency radio signal receiving apparatus for digital communication according to claim 5, further comprising:

a delay circuit for delaying the signal outputted from said frequency converter, before said signal is supplied to said impulsive noise correcting means.

7. A high-frequency radio signal receiving apparatus for digital communication according to claim 5, further comprising:
   a waveform shaper for shaping the signal outputted from said impulsive noise detecting means;
   a pulse width measuring circuit for measuring a pulse width of a digital signal outputted from said waveform shaper;
   decision means for making decision concerning reliability of received data on the basis of a signal outputted from said pulse width measuring circuit; and
   messaging means for in forming a result of decision performed by said decision means.

8. A high-frequency radio signal receiving apparatus for digital communication according to claim 5, said impulsive noise detecting means including:
   an envelope detector for detecting an envelope of the signal outputted from said frequency converter;
   a mean input level detector for detecting a mean level of a signal outputted from said envelope detector; and
   a comparator for detecting impulsive noise by comparing two signals outputted from said envelope detector and said mean input level detector, respectively.

9. A high-frequency radio signal receiving apparatus for digital communication according to claim 8, further comprising:
   a waveform shaper for shaping the signal outputted from said impulsive noise detecting means;
   a pulse width measuring circuit for measuring a pulse width of a digital signal outputted from said waveform shaper;
   decision means for making decision concerning reliability of received data on the basis of a signal outputted from said pulse width measuring circuit; and
   messaging means for informing a result of decision performed by said decision means.

10. A high-frequency radio signal receiving apparatus for digital communication, comprising:
    a receiving antenna for receiving a high frequency radio wave;
    a frequency converter for converting a signal supplied from said receiving antenna into a signal of an intermediate frequency band;
    impulsive noise detecting means for detecting impulsive noise on the basis of a signal outputted from said frequency converter, said impulsive noise detecting means including:
       an envelope detector for detecting an envelope of the signal outputted from said frequency converter;
       a mean input level detector for detecting a mean level of a signal outputted from said envelope detector; and
       a comparator for detecting impulsive noise by comparing two signals outputted from said envelope detector and said mean input level detector, respectively;
    impulsive noise correcting means for correcting the signal outputted from said frequency converter in dependence on a signal outputted from said impulsive noise detecting means; and
    demodulating means for demodulating a signal outputted from said impulsive noise correcting means.

11. A high-frequency radio signal receiving apparatus for digital communication, comprising:
    a receiving antenna for receiving a high frequency radio wave;
    a frequency converter for converting a signal supplied from said receiving antenna into a signal of an intermediate frequency band;
    impulsive noise detecting means for detecting impulsive noise on the basis of a signal outputted from said frequency converter;
    impulsive noise correcting means for correcting the signal outputted from said frequency converter in dependence on a signal outputted from said impulsive noise detecting means; and
    demodulating means for demodulating a signal outputted from said impulsive noise correcting means;
    a waveform shaper for shaping the signal outputted from said impulsive noise detecting means;
    a pulse width measuring circuit for measuring a pulse width of a digital signal outputted from said waveform shaper;
    decision means for making decision concerning reliability of received data on the basis of a signal outputted from said pulse width measuring circuit; and
    messaging means for informing a result of decision performed by said decision means.

12. A high-frequency radio signal receiving apparatus for digital communication comprising:
    a receiving antenna for receiving a high frequency radio wave;
    a frequency converter for converting a signal supplied from said receiving antenna into a signal of an intermediate frequency band;
    impulsive noise detecting means for detecting impulsive noise on the basis of a signal outputted from said frequency converter;
    impulsive noise correcting means for correcting the signal outputted from said frequency converter in dependence on a signal outputted from said impulsive noise detecting means, said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to around potential, wherein when a signal indicating detection of impulsive noise is outputted from said impulsive noise detecting means, said second terminal of the multiplexer-type three-terminal switch of the impulsive noise correcting unit is connected to said third terminal;
    a waveform shaper for shaping the signal outputted from said impulsive noise detecting means;
    a pulse width measuring circuit for measuring a pulse width of a digital signal outputted from said waveform shaper;
    decision means for making decision concerning reliability of received data on the basis of a signal outputted from said pulse width measuring circuit; and
    messaging means for informing a result of decision performed by said decision means.

13. A high-frequency radio signal receiving apparatus for digital communication comprising:
    a receiving antenna for receiving a high frequency radio wave;
    a frequency converter for converting a signal supplied from said receiving antenna into a signal of an intermediate frequency band;

impulsive noise detecting means for detecting impulsive noise on the basis of a signal outputted from said frequency converter, said impulsive noise detecting means including:
   an envelope detector for detecting an envelope of the signal outputted from said frequency converter;
   a mean input level detector for detecting a mean level of a signal outputted from said envelope detector; and
   a comparator for detecting impulsive noise by comparing two signals outputted from said envelope detector and said mean input level detector, respectively;

impulsive noise correcting means for correcting the signal outputted from said frequency converter in dependence on a signal outputted from said impulsive noise detecting means, said impulsive noise correcting means including
   a multiplexer-type three-terminal switch having a first terminal serving as an input terminal for the signal outputted from said frequency, converter, a second terminal serving as an output terminal of said impulsive noise correcting means and a third terminal connected to around potential,
   wherein when a signal indicating detection of impulsive noise is outputted from said impulsive noise detecting means, said second terminal of the multiplexer-type three-terminal switch of the impulsive noise correcting unit is connected to said third terminal, and demodulating means for demodulating a signal outputted from said impulsive noise correcting means.

14. A high-frequency radio signal receiving apparatus for digital communication according to claim 13, further comprising:
   a waveform shaper for shaping the signal outputted from said impulsive noise detecting means;
   a pulse width measuring circuit for measuring a pulse width of a digital signal outputted from said waveform shaper;
   decision means for making decision concerning reliability of received data on the basis of a signal outputted from said pulse width measuring circuit; and
   messaging means for informing a result of decision performed by said decision means.

15. A high-frequency radio signal receiving apparatus for digital communication, comprising:
   a receiving antenna for receiving a high frequency radio wave;
   a frequency converter for converting a signal supplied from said receiving antenna through a wide band bandpass filter into a signal of an intermediate frequency band;
   impulsive noise detecting means for detecting impulsive noise on the basis of a signal outputted from said frequency converter;
   impulsive noise correcting means for correcting the signal outputted from said frequency converter in dependence on a signal outputted from said impulsive noise detecting means, said impulsive noise correcting means including:
     an on/off-type two-terminal switch; and
     an attenuator connected to said on/off-type two- terminal switch in parallel, and for attenuating a signal when said on/off- type two-terminal switch is opened,
   wherein when a signal indicating detection of impulsive noise is outputted from said impulsive noise detecting means, said on/off-type two-terminal switch of said impulsive noise correcting means is opened to thereby allow the signal outputted from said frequency converter to be attenuated by said attenuator, whereby the impulsive noise is suppressed from the signal outputted from said frequency converter without increasing a reception error ratio; and demodulating means for demodulating a signal outputted from said impulsive noise correcting means.

16. A high-frequency radio signal receiving apparatus for digital communication according to claim 15, further comprising:
   a delay circuit for delaying the signal outputted from said frequency converter, before said signal is supplied to said impulsive noise correcting means.

17. A high-frequency radio signal receiving apparatus for digital communication according to claim 15, said impulsive noise detecting means including:
   an envelope detector for detecting an envelope of the signal outputted from said frequency converter;
   a mean input level detector for detecting a mean level of a signal outputted from said envelope detector; and
   a comparator for detecting impulsive noise by comparing two signals outputted from said envelope detector and said mean input level detector, respectively.

18. A high-frequency radio signal receiving apparatus for digital communication according to claim 17, further comprising:
   a waveform shaper for shaping the signal outputted from said impulsive noise detecting means;
   a pulse width measuring circuit for measuring a pulse width of a digital signal outputted from said waveform shaper;
   decision means for making decision concerning reliability of received data on the basis of a signal outputted from said pulse width measuring circuit; and
   messaging means for informing a result of decision performed by said decision means.

19. A high-frequency radio signal receiving apparatus for digital communication according to claim 15,
   said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to ground potential,
   wherein when a signal indicating detection of impulsive noise is outputted from said impulsive noise detecting means, said second terminal of the multiplexer-type three-terminal switch of the impulsive noise correcting unit is connected to said third terminal.

20. A high-frequency radio signal receiving apparatus for digital communication according to claim 19, further comprising:
   a delay circuit for delaying the signal outputted from said frequency converter, before said signal is supplied to said impulsive noise correcting means.

21. A high-frequency radio signal receiving apparatus for digital communication according to claim 19, further comprising:
   a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

22. A high-frequency radio signal receiving apparatus for digital communication according to claim 19, said impulsive noise detecting means including:

an envelope detector for detecting an envelope of the signal outputted from said frequency converter;

a mean input level detector for detecting a mean level of a signal outputted from said envelope detector; and a comparator for detecting impulsive noise by comparing two signals outputted from said envelope detector and said mean input level detector, respectively.

23. A high-frequency radio signal receiving apparatus for digital communication according to claim 22, further comprising:

a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

24. A high-frequency radio signal receiving apparatus for digital communication, comprising:

a receiving antenna for receiving a high frequency radio wave;

a frequency converter for converting a signal supplied from said receiving antenna through a wide band bandpass filter into a signal of an intermediate frequency band;

impulsive noise detecting means for detecting impulsive noise on the basis of a signal outputted from said frequency converter, said impulsive noise detecting means including:

an envelope detector for detecting an envelope of the signal outputted from said frequency converter;

a mean input level detector for detecting a mean level of a signal outputted from said envelope detector; and a comparator for detecting impulsive noise by comparing two signals outputted from said envelope detector and said mean input level detector, respectively;

impulsive noise correcting means for correcting the signal outputted from said frequency converter in dependence on a signal outputted from said impulsive noise detecting means; and demodulating means for demodulating a signal outputted from said impulsive noise correcting means.

25. A high-frequency radio signal receiving apparatus for digital communication, comprising:

a receiving antenna for receiving a high frequency radio wave;

a frequency converter for converting a signal supplied from said receiving antenna through a wide band bandpass filter into a signal of an intermediate frequency band;

impulsive noise detecting means for detecting impulsive noise on the basis of a signal outputted from said frequency converter;

impulsive noise correcting means for correcting the signal outputted from said frequency converter in dependence on a signal outputted from said impulsive noise detecting means;

demodulating means for demodulating a signal outputted from said impulsive noise correcting means, a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

26. A high-frequency radio signal receiving apparatus for digital communication, comprising:

a receiving antenna for receiving a high frequency radio wave;

a frequency converter for converting a signal supplied from said receiving antenna through a wide band bandpass filter into a signal of an intermediate frequency band;

impulsive noise detecting means for detecting impulsive noise on the basis of a signal outputted from said frequency converter;

impulsive noise correcting means for correcting the signal outputted from said frequency converter in dependence on a signal outputted from said impulsive noise detecting means; said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to around potential, wherein when a signal indicating detection of impulsive noise is outputted from said impulsive noise detecting means, said second terminal of the multiplexer-type three-terminal switch of the impulsive noise correcting unit is connected to said third terminal;

demodulating means for demodulating a signal outputted from said impulsive noise correcting means, a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

27. A high-frequency radio signal receiving apparatus for digital communication, comprising:

a receiving antenna for receiving a high frequency radio wave;

a frequency converter for converting a signal supplied from said receiving antenna through a wide band bandpass filter into a signal of an intermediate frequency band;

impulsive noise detecting means for detecting impulsive noise on the basis of a signal outputted from said frequency converter, said impulsive noise detecting means including:
- an envelope detector for detecting an envelope of the signal outputted from said frequency converter;
- a mean input level detector for detecting a mean level of a signal outputted from said envelope detector; and
- a comparator for detecting impulsive noise by comparing two signals outputted from said envelope detector and said mean input level detector, respectively;

impulsive noise correcting means for correcting the signal outputted from said frequency converter in dependence on a signal outputted from said impulsive noise detecting means, said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to around potential, wherein when a signal indicating detection of impulsive noise is outputted from said impulsive noise detecting means, said second terminal of the multiplexer-type three-terminal switch of the impulsive noise correcting unit is connected to said third terminal; and demodulating means for demodulating a signal outputted from said impulsive noise correcting means.

28. A high-frequency radio signal receiving apparatus for digital communication according to claim 27, further comprising:
- a waveform shaper for shaping the signal outputted from said impulsive noise detecting means;
- a pulse width measuring circuit for measuring a pulse width of a digital signal outputted from said waveform shaper;
- decision means for making decision concerning reliability of received data on the basis of a signal outputted from said pulse width measuring circuit; and
- messaging means for informing a result of decision performed by said decision means.

29. A high-frequency radio signal receiving apparatus for digital communication, comprising:
- a receiving antenna for receiving a high frequency radio wave;
- a frequency converter for converting a signal supplied from said receiving antenna into a signal of an intermediate frequency band;
- impulsive noise detecting means for detecting impulsive noise on the basis of a signal outputted from said frequency converter;
- impulsive noise correcting means for correcting the signal outputted from said frequency converter in dependence on a signal outputted from said impulsive noise detecting means, said impulsive noise correcting means including:
  - an on/off-type two-terminal switch; and
  - an attenuator connected to said on/off-type two-terminal switch in parallel, and for attenuating the signal when said on/off-type two-terminal switch is opened,
  - wherein when a signal indicating detection of impulsive noise is outputted from said impulsive noise detecting means, said on/off-type two-terminal switch of said impulsive noise correcting means is opened to thereby allow the signal outputted from said frequency converter to be attenuated by said attenuator, whereby the impulsive noise is suppressed from the signal outputted from said frequency converter without increasing a reception error ratio; and
- demodulating means for demodulating a signal outputted from said impulsive noise correcting means and supplied by way of a narrow-band bandpass filter.

30. A high-frequency radio signal receiving apparatus for digital communication according to claim 29, further comprising:
- a delay circuit for delaying the signal outputted from said frequency converter, before said signal is supplied to said impulsive noise correcting means.

31. A high-frequency radio signal receiving apparatus for digital communication according to claim 29, said impulsive noise detecting means including:
- an envelope detector for detecting an envelope of the signal outputted from said frequency converter;
- a mean input level detector for detecting a mean level of a signal outputted from said envelope detector; and
- a comparator for detecting impulsive noise by comparing two signals outputted from said envelope detector and said mean input level detector, respectively.

32. A high-frequency radio signal receiving apparatus for digital communication according to claim 29, further comprising:
- a waveform shaper for shaping the signal outputted from said impulsive noise detecting means;
- a pulse width measuring circuit for measuring a pulse width of a digital signal outputted from said waveform shaper;
- decision means for making decision concerning reliability of received data on the basis of a signal outputted from said pulse width measuring circuit; and
- messaging means for informing a result of decision performed by said decision means.

33. A high-frequency radio signal receiving apparatus for digital communication according to claim 29, said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to ground potential,
wherein when a signal indicating detection of impulsive noise is outputted from said impulsive noise detecting means, said second terminal of the multiplexer-type three-terminal switch of the impulsive noise correcting unit is connected to said third terminal.

34. A high-frequency radio signal receiving apparatus for digital communication according to claim 33, further comprising:
- a delay circuit for delaying the signal outputted from said frequency converter, before said signal is supplied to said impulsive noise correcting means.

35. A high-frequency radio signal receiving apparatus for digital communication according to claim 33, further comprising:
- a waveform shaper for shaping the signal outputted from said impulsive noise detecting moans;
- a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

36. A high-frequency radio signal receiving apparatus for digital communication according to claim 33, said impulsive noise detecting means including:

an envelope detector for detecting an envelope of the signal outputted from said frequency converter;

a mean input level detector for detecting a mean level of a signal outputted from said envelope detector; and a comparator for detecting impulsive noise by comparing two signals outputted from said envelope detector and said mean input level detector, respectively.

37. A high-frequency radio signal receiving apparatus for digital communication according to claim 36, further comprising:

a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

38. A high-frequency radio signal receiving apparatus for digital communication, comprising:

a receiving antenna for receiving a high frequency radio wave;

a frequency converter for converting a signal supplied from said receiving antenna into a signal of an intermediate frequency band;

impulsive noise detecting means for detecting impulsive noise on the basis of a signal outputted from said frequency converter, said impulsive noise detecting means including:

an envelope detector for detecting an envelope of the signal outputted from said frequency converter;

a mean input level detector for detecting a mean level of a signal outputted from said envelope detector; and a comparator for detecting impulsive noise by comparing two signals outputted from said envelope detector and said mean input level detector, respectively;

impulsive noise correcting means for correcting the signal outputted from said frequency converter in dependence on a signal outputted from said impulsive noise detecting means; and demodulating means for demodulating a signal outputted from said impulsive noise correcting means and supplied by way of a narrow-band bandpass filter.

39. A high-frequency radio signal receiving apparatus for digital communication comprising:

a receiving antenna for receiving a high frequency radio wave;

a frequency converter for converting a signal supplied from said receiving antenna into a signal of an intermediate frequency band;

impulsive noise detecting means for detecting impulsive noise on the basis of a signal outputted from said frequency converter;

impulsive noise correcting means for correcting the signal outputted from said frequency converter in dependence on a signal outputted from said impulsive noise detecting means;

demodulating means for demodulating a signal outputted from said impulsive noise correcting means and supplied by way of a narrow-band bandpass filter, a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

40. A high-frequency radio signal receiving apparatus for digital communication, comprising:

a receiving antenna for receiving a high frequency radio wave;

a frequency converter for converting a signal supplied from said receiving antenna into a signal of an intermediate frequency band;

impulsive noise detecting means for detecting impulsive noise on the basis of a signal outputted from said frequency converter;

impulsive noise correcting means for correcting the signal outputted from said frequency converter in dependence on a signal outputted from said impulsive noise detecting means, said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to around potential, wherein when a signal indicating detection of impulsive noise is outputted from said impulsive noise detecting means, said second terminal of the multiplexer-type three-terminal switch of the impulsive noise correcting unit is connected to said third terminal;

demodulating means for demodulating a signal outputted from said impulsive noise correcting means and supplied by way of a narrow-band bandpass filter, a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

41. A high-frequency radio signal receiving apparatus for digital communication, comprising:

a receiving antenna for receiving a high frequency radio wave;

a frequency converter for converting a signal supplied from said receiving antenna into a signal of an intermediate frequency band;

impulsive noise detecting means for detecting impulsive noise on the basis of a signal outputted from said frequency converter, said impulsive noise detecting means including:

an envelope detector for detecting an envelope of the signal outputted from said frequency converter;

a mean input level detector for detecting a mean level of a signal outputted from said envelope detector; and a comparator for detecting impulsive noise by comparing two signals outputted from said envelope detector and said mean input level detector, respectively;

impulsive noise correcting means for correcting the signal outputted from said frequency converter in dependence on a signal outputted from said impulsive noise detecting means, said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to around potential, wherein when a signal indicating detection of impulsive noise is outputted from said impulsive noise detecting means, said second terminal of the multiplexer-type three-terminal switch of the impulsive noise correcting unit is connected to said third terminal; and demodulating means for demodulating a signal outputted from said impulsive noise correcting means and supplied by way of a narrow-band bandpass filter.

42. A high-frequency radio signal receiving apparatus for digital communication according to claim 41, further comprising:

a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

43. A high-frequency radio signal receiving apparatus for digital communication, comprising:

a receiving antenna for receiving a high frequency radio wave;

a frequency converter for converting a signal supplied from said receiving antenna through a wide band bandpass filter into a signal of an intermediate frequency band;

impulsive noise detecting means for detecting impulsive noise on the basis of a signal outputted from said frequency converter;

impulsive noise correcting means for correcting the signal outputted from said frequency converter in dependence on a signal outputted from said impulsive noise detecting means, said impulsive noise correcting means including:

an on/off-type two-terminal switch; and an attenuator connected to said on/off type two-terminal switch in parallel, and for attenuating a signal when said on/off- type two-terminal switch is opened, wherein when a signal indicating detection of impulsive noise is outputted from said impulsive noise detecting means, said on/off-type two-terminal switch of said impulsive noise correcting means is opened to thereby allow the signal outputted from said frequency converter to be attenuated by said attenuator, whereby the impulsive noise is suppressed from the signal outputted from said frequency converter without increasing a reception error ratio; and demodulating means for demodulating a signal outputted from said impulsive noise correcting means and supplied by way of a narrow-band bandpass filter.

44. A high-frequency radio signal receiving apparatus for digital communication according to claim 43, further comprising:

a delay circuit for delaying the signal outputted from said frequency converter, before said signal is supplied to said impulsive noise correcting means.

45. A high-frequency radio signal receiving apparatus for digital communication according to claim 43, said impulsive noise detecting means including:

an envelope detector for detecting an envelope of the signal outputted from said frequency converter;

a mean input level detector for detecting a mean level of a signal outputted from said envelope detector; and a comparator for detecting impulsive noise by comparing two signals outputted from said envelope detector and said mean input level detector, respectively.

46. A high-frequency radio signal receiving apparatus for digital communication according to claim 43, further comprising:

a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

47. A high-frequency radio signal receiving apparatus for digital communication according to claim 43, said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to ground potential, wherein when a signal indicating detection of impulsive noise is outputted from said impulsive noise detecting means, said second terminal of the multiplexer-type three-terminal switch of the impulsive noise correcting unit is connected to said third terminal.

48. A high-frequency radio signal receiving apparatus for digital communication according to claim 47, further comprising:

a delay circuit for delaying the signal outputted from said frequency converter, before said signal is supplied to said impulsive noise correcting means.

49. A high-frequency radio signal receiving apparatus for digital communication according to claim 47, further comprising:

a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

50. A high-frequency radio signal receiving apparatus for digital communication according to claim 47, said impulsive noise detecting means including:

an envelope detector for detecting an envelope of the signal outputted from said frequency converter;

a mean input level detector for detecting a mean level of a signal outputted from said envelope detector; and a comparator for detecting impulsive noise by comparing two signals outputted from said envelope detector and said mean input level detector, respectively.

51. A high-frequency radio signal receiving apparatus for digital communication according to claim 50, further comprising:

a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

52. A high-frequency radio signal receiving apparatus for digital communication, comprising:

a receiving antenna for receiving a high frequency radio wave;

a frequency converter for converting a signal supplied from said receiving antenna through a wide band bandpass filter into a signal of an intermediate frequency band;

impulsive noise detecting means for detecting impulsive noise on the basis of a signal outputted from said frequency converter, said impulsive noise detecting means including:

an envelope detector for detecting an envelope of the signal outputted from said frequency converter;

a mean input level detector for detecting a mean level of a signal outputted from said envelope detector; and a comparator for detecting impulsive noise by comparing two signals outputted from said envelope detector and said mean input level detector, respectively;

impulsive noise correcting means for correcting the signal outputted from said frequency converter in dependence on a signal outputted from said impulsive noise detecting means; and demodulating means for demodulating a signal outputted from said impulsive noise correcting means and supplied by way of a narrow-band bandpass filter.

53. A high-frequency radio signal receiving apparatus for digital communication, comprising:

a receiving antenna for receiving a high frequency radio wave;

a frequency converter for converting a signal supplied from said receiving antenna through a wide band bandpass filter into a signal of an intermediate frequency band;

impulsive noise detecting means for detecting impulsive noise on the basis of a signal outputted from said frequency converter;

impulsive noise correcting means for correcting the signal outputted from said frequency converter in dependence on a signal outputted from said impulsive noise detecting means; and demodulating means for demodulating a signal outputted from said impulsive noise correcting means and supplied by way of a narrow-band bandpass filter, a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

54. A high-frequency radio signal receiving apparatus for digital communication, comprising:

a receiving antenna for receiving a high frequency radio wave;

a frequency converter for converting a signal supplied from said receiving antenna through a wide band bandpass filter into a signal of an intermediate frequency band;

impulsive noise detecting means for detecting impulsive noise on the basis of a signal outputted from said frequency converter;

impulsive noise correcting means for correcting the signal outputted from said frequency converter in dependence on a signal outputted from said impulsive noise detecting means, said impulsive noise correcting means including:

a multiplexer-type three-terminal switch having a first terminal serving as an input terminal for the signal outputted from said frequency converter, a second terminal serving as an output terminal of said impulsive noise correcting means and a third terminal connected to around potential, wherein when a signal indicating detection of impulsive noise is outputted from said impulsive noise detecting means, said second terminal of the multiplexer-type three-terminal switch of the impulsive noise correcting unit is connected to said third terminal;

demodulating means for demodulating a signal outputted from said impulsive noise correcting means and supplied by way of a narrow-band bandpass filter;

a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

55. A high-frequency radio signal receiving apparatus for digital communication, comprising:

a receiving antenna for receiving a high frequency radio wave;

a frequency converter for converting a signal supplied from said receiving antenna through a wide band bandpass filter into a signal of an intermediate frequency band;

impulsive noise detecting means for detecting impulsive noise on the basis of a signal outputted from said frequency converter, said impulsive noise detecting means including:
- an envelope detector for detecting an envelope of the signal outputted from said frequency converter;
- a mean input level detector for detecting a mean level of a signal outputted from said envelope detector; and
- a comparator for detecting impulsive noise by comparing two signals outputted from said envelope detector and said mean input level detector, respectively;

impulsive noise correcting means for correcting the signal outputted from said frequency converter in dependence on a signal outputted from said impulsive noise detecting means, said impulsive noise correcting means including a multiplexer-type three-terminal switch having a first terminal serving as an input terminal for the signal outputted from said frequency converter, a second terminal serving as an output terminal of said impulsive noise correcting means and a third terminal connected to around potential, wherein when a signal indicating detection of impulsive noise is outputted from said impulsive noise detecting means, said second terminal of the multiplexer-type three-terminal switch of the impulsive noise correcting unit is connected to said third terminal; and demodulating means for demodulating a signal outputted from said impulsive noise correcting means and supplied by way of a narrow-band bandpass filter.

56. A high-frequency radio signal receiving apparatus for digital communication according to claim 55, further comprising:

a waveform shaper for shaping the signal outputted from said impulsive noise detecting means;

a pulse width measuring circuit for measuring a pulse width of a digital signal outputted from said waveform shaper;

decision means for making decision concerning reliability of received data on the basis of a signal outputted from said pulse width measuring circuit; and messaging means for informing a result of decision performed by said decision means.

* * * * *